United States Patent
Wilson et al.

(10) Patent No.: US 7,807,492 B2
(45) Date of Patent: Oct. 5, 2010

(54) MAGNETORESISTIVE RANDOM ACCESS MEMORY WITH IMPROVED LAYOUT DESIGN AND PROCESS THEREOF

(75) Inventors: Vicki Wilson, St. Paul, MN (US); Guoqing Zhan, St. Paul, MN (US); James Chyi Lai, St. Paul, MN (US)

(73) Assignee: Northern Lights Semiconductor Corp., St. Paul, MN (US)

( * ) Notice: Subject to any disclaimer, the term of this patent is extended or adjusted under 35 U.S.C. 154(b) by 479 days.

(21) Appl. No.: 11/533,126

(22) Filed: Sep. 19, 2006

(65) Prior Publication Data
US 2007/0069314 A1    Mar. 29, 2007

Related U.S. Application Data

(60) Provisional application No. 60/721,215, filed on Sep. 28, 2005, provisional application No. 60/721,216, filed on Sep. 28, 2005.

(51) Int. Cl.
*H01L 21/00*    (2006.01)

(52) U.S. Cl. .................................. 438/48; 257/421
(58) Field of Classification Search ................ 257/314, 257/3, 785, E21.208, 257, E21.436, E21.663–E21.665
See application file for complete search history.

(56) References Cited

U.S. PATENT DOCUMENTS

2005/0270831 A1*  12/2005  Witcraft et al. ............. 365/158
2006/0102970 A1*   5/2006  Butcher et al. .............. 257/421

\* cited by examiner

*Primary Examiner*—Quoc D Hoang
*Assistant Examiner*—Tony Tran
(74) *Attorney, Agent, or Firm*—Thomas, Kayden, Horstemeyer & Risley, LLP

(57) ABSTRACT

A MRAM memory and process thereof is described. A GMR magnetic layer is patterned to form a memory bit layer and an intermediate conductive layer. The intermediate conductive layer is disposed between two conductive layers such that shallow metal plugs can be utilized to interconnect the intermediate conductive layer and the conductive layers. Thus, a conventional deep tungsten plug process, interconnecting two conductive layers, is eliminated.

10 Claims, 2 Drawing Sheets

MAGNETORESISTIVE RANDOM ACCESS MEMORY WITH IMPROVED LAYOUT DESIGN AND PROCESS THEREOF

RELATED APPLICATIONS

The present application claims benefit of and priority to U.S. provisional Application No. 60/721,215, filed Sep. 28, 2005 and U.S. provisional Application No. 60/721,216, filed Sep. 28, 2005, the disclosure of which is hereby incorporated by reference herein in its entirety.

BACKGROUND

1. Field of Invention

The present invention generally relates to a memory technology. More particularly, the present invention relates to non-volatile magnetic memory.

2. Description of Related Art

Computers and other digital systems use memory to store programs and data. A common form of memory is random access memory (RAM). Many memory devices, such as dynamic random access memory (DRAM) and static random access memory (SRAM) devices are volatile memories. A volatile memory loses its data when power is removed.

In contrast to the potential loss of data encountered in volatile memory devices, nonvolatile memory devices retain data for long periods of time when power is removed. Examples of nonvolatile memory devices include read only memory (ROM), programmable read only memory (PROM), erasable PROM (EPROM) and the like.

An alternative memory device is known as magnetoresistive random access memory (MRAM). An MRAM device uses magnetic orientations to retain data in its memory cells. There are at least three different types of MRAM devices, wherein one of them is giant magneto-resistance (GMR) MRAM device.

During the conventional process of a GMR MRAM device, a GMR magnetic layer is formed between an underlying dielectric layer and an overlying dielectric layer only in partial area. In other partial areas of the GMR MRAM device, deep vias or plugs must electrically connect an overlying conductive layer formed above the overlying dielectric layer and an underlying conductive layer formed under the underlying dielectric layer. High contact resistance is formed between these two conductive layers due to deep vias or plugs.

SUMMARY

A MRAM memory device and manufacturing process thereof is described. A first conductive layer is formed on a substrate. A first dielectric layer is formed on the first conductive layer. The first dielectric layer is patterned to form a first opening exposing the first conductive layer. A first metal plug is formed in the first opening to electrically connect the first conductive layer. A GMR magnetic layer is formed on the first dielectric layer and the first metal plug. The GMR magnetic layer is patterned to form a memory bit layer and an intermediate conductive layer. A second dielectric layer is formed on the GMR magnetic layer. The first dielectric layer is patterned to form a second opening exposing the first intermediate conductive layer. A second metal plug is formed in the second opening to electrically connect the intermediate conductive layer. A second conductive layer is formed on the second dielectric layer and the second metal plug.

It is to be understood that both the foregoing general description and the following detailed description are by examples, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE EMBODIMENTS

It is to be understood that the following disclosure provides many different embodiments, or examples, for implementing different features of various embodiments. Specific examples of components and arrangements are described below to simplify the present disclosure. However, these are merely examples, and not intended to be limiting. In addition, the present disclosure may repeat reference numbers and/or letters in the various examples. This repetition is for the purpose of simplicity and clarity and does not itself dictate a relationship between the various embodiments and/or configurations.

Figure 1:
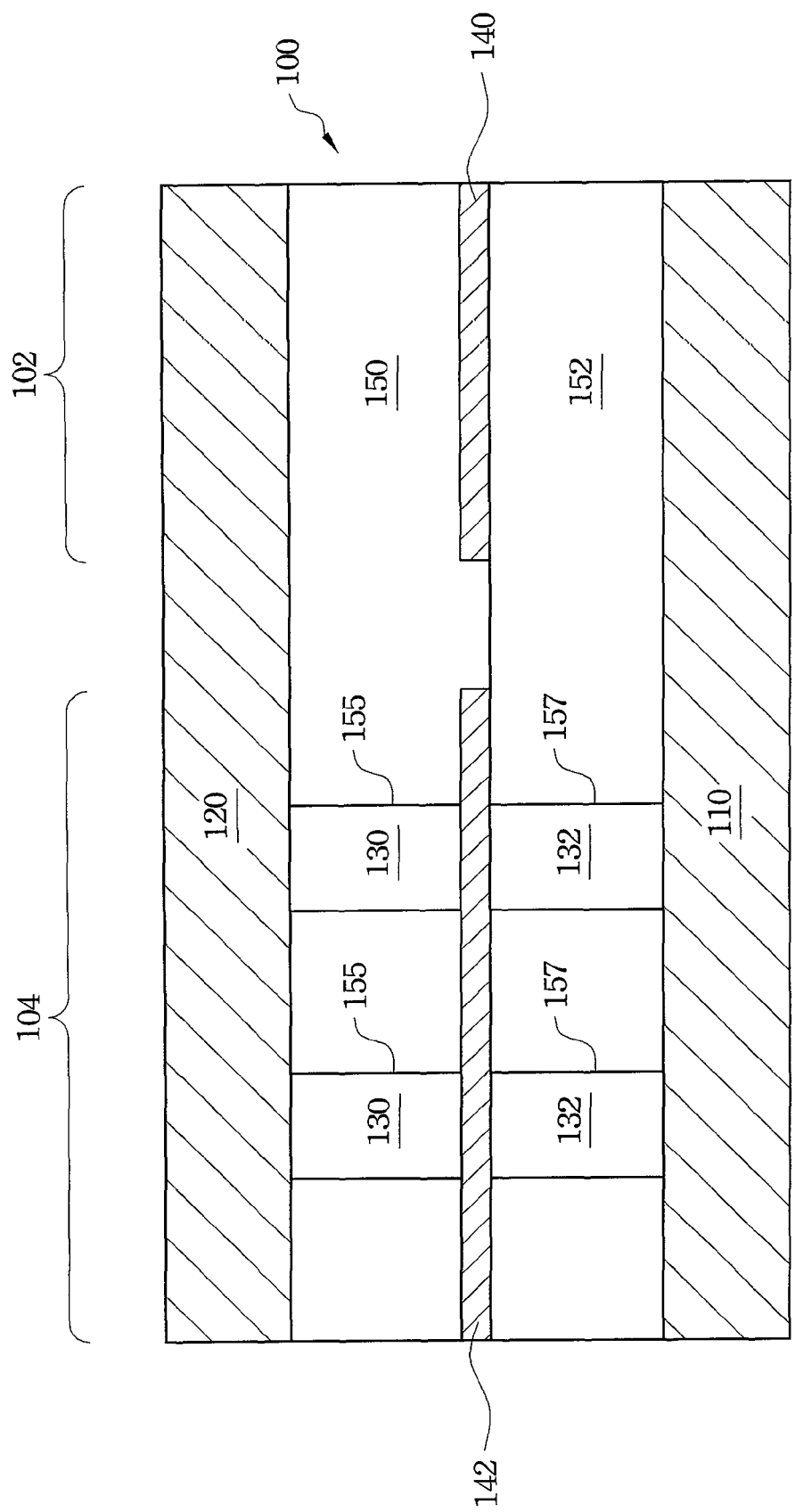
FIG. 1 illustrates a sectional view of at least a portion of a MRAM memory device according to one embodiment of this invention.

Referring to FIG. 1, which illustrates a sectional view of at least a portion of a MRAM memory device according to one embodiment of this invention. A device 100 is constructed on a substrate (not illustrated in drawings), which may comprise silicon, silicon germanium, and/or other Group III-V semiconductors.

The device 100 includes a storage area 102 and a non-storage area 104. In the storage area 102, a GMR (giant magneto-resistance) memory bit layer 140, made by a GMR magnetic layer, is sandwiched between dielectric layers 150 and 152. The GMR memory bit layer 140 can store a digital data of "1" or "0". In the non-storage area 104, an intermediate conductive layer 142, also made by the same GMR magnetic layer, is also sandwiched between dielectric layers 150 and 152. The GMR magnetic layer described above includes at least a nonmagnetic metal layer sandwiched between two ferromagnetic metal layers.

In a conventional process of a MRAM device, there is no intermediate conductive layer 142 between conductive layers 110 and 120, a deep plug is thus necessary to connect the conductive layer 110 and the conductive layer 120. As the GMR magnetic layer serves as an intermediate conductive layer 142, shallow plugs 132 is utilized to connect the intermediate conductive layer 142 and the conductive layer 110, and shallow plugs 130 is utilized to connect the intermediate conductive layer 142 and the conductive layer 120. Because of the intermediate conductive layer, shallow plugs of low resistance can be utilized. In this embodiment, shallow metal plugs 130 and shallow metal plugs 132 together forms stacked metal plugs. The metal plugs 130 and 132 can be tungsten plugs.

In this embodiment, the intermediate conductive layer 142 and the GMR memory bit layer 140 are formed at the same time by, for example, deposition, photolithography, etching and ion mill processes, no additional steps are thus required.

The intermediate conductive layer 142 and the GMR memory bit layer 140 can be multilayer GMR, spin-valve GMR or granular GMR.

The conductive layers 110 and 120 may individually comprise one or more conductive materials, such as aluminum, copper, alloys thereof, and/or other conductive materials. The conductive layers 110 and 120 may be further electrically connected with other conductive layers through additional metal plugs.

The dielectric layers 150 and 152 may comprise one or more dielectric materials, such as silicon oxide, low-k dielectric material, and/or other dielectric materials.

Referring to FIG. 1 again, exemplary fabrication processes is described herein. The conductive layer 110 is formed on a substrate (not illustrated). The dielectric layer 152 is formed on the conductive layer 110. The dielectric layer 152 is patterned to form openings 157 exposing the underlying conductive layer 110. Metal plugs 132 are then formed in the openings 157 to electrically connect the conductive layer 110. A GMR magnetic layer is formed on the dielectric layer 152 and the metal plugs 132, and further patterned to form a GMR memory bit layer 140 and an intermediate conductive layer 142. The dielectric layer 150 is formed on the GMR magnetic layer. The dielectric layer 150 is patterned to form openings 155 exposing the underlying intermediate conductive layer 142. Metal plugs 130 are formed in openings 155 to electrically connect the intermediate conductive layer 142. Metal plugs 132 are located on top of metal plugs 130 such that metal plugs 132 and metal plugs 130 form stacked metal plugs. The conductive layer 120 is formed on the dielectric layer 150 and metal plugs 134.

Figure 2:
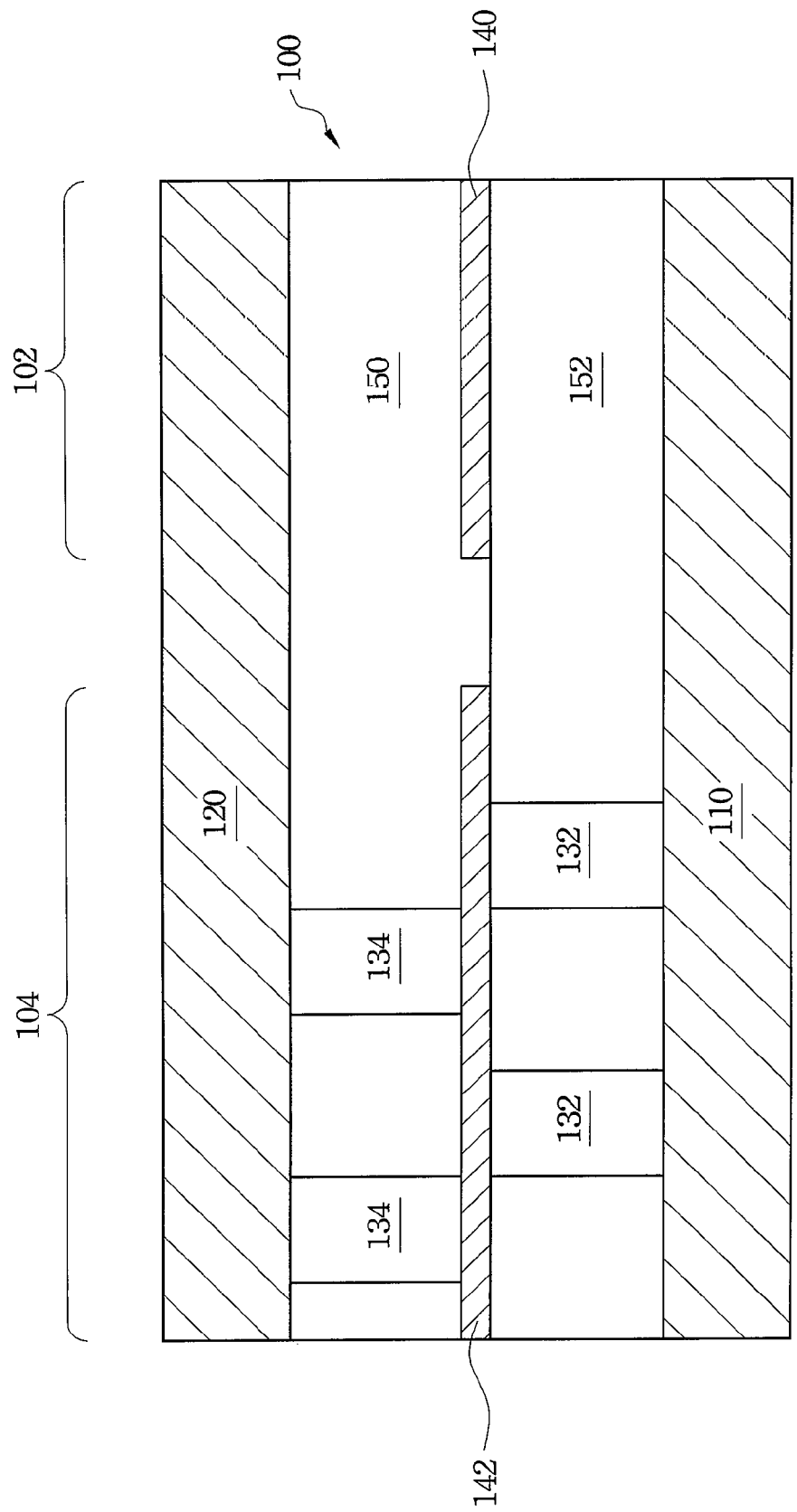
FIG. 2 illustrates a sectional view of at least a portion of a MRAM memory device according to another embodiment of this invention.

Referring to FIG. 2, which illustrates a sectional view of at least a portion of a MRAM memory device according to another embodiment of this invention. This embodiment is slightly different from the embodiment illustrated in FIG. 1. In particular, metal plugs 132 and metal plugs 134 do not form stacked metal plugs. That is, each of metal plugs 132 and metal plugs 134 forms a non-stacked metal plug separately. More options in layout design are available in such plug arrangements in the non-storage area 104, and a process yield may improve due to fewer stacked plugs in the non-storage area 104.

A fabricating process for the embodiment in FIG. 2 is almost the same as that in FIG. 1 except that metal plugs 134 is not located on top of metal plugs 132.

According to above embodiments, the layout design improvement of MRAM uses the GMR magnetic layer as an intermediate conductive layer. A conventional deep tungsten plug process is thus eliminated. Shallow plugs are utilized instead of deep plug process such that resistance between conductive layers is lowered due to shallow plugs and the intermediate conductive layer. In addition, the GMR magnetic layer may serve as an additional routing layer, more options in layout design are thus available.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A MRAM memory process, comprising:
   forming a first conductive layer on a substrate;
   forming a first dielectric layer on the first conductive layer;
   patterning the first dielectric layer to form a first opening exposing the first conductive layer;
   forming a first metal plug in the first opening to electrically connect the first conductive layer;
   forming a GMR magnetic layer on the first dielectric layer and the first metal plug;
   patterning the GMR magnetic layer to form two separate portions of the GMR magnetic layer with one portion as an intermediate conductive layer and the other portion as a memory bit layer;
   forming a second dielectric layer on the GMR magnetic layer;
   patterning the second dielectric layer to form a second opening exposing the intermediate conductive layer;
   forming a second metal plug in the second opening to electrically connect the intermediate conductive layer; and
   forming a second conductive layer on the second dielectric layer and the second metal plug.

2. The MRAM memory process of claim 1, wherein the first metal plug and the second metal plug form a stacked metal plug.

3. The MRAM memory process of claim 1, wherein the first metal plug and the second metal plug respectively form non-stacked metal plugs.

4. The MRAM memory process of claim 1, wherein the first metal plug is a tungsten plug.

5. The MRAM memory process of claim 1, wherein the second metal plug is a tungsten plug.

6. A MRAM memory process comprising:
   forming a first conductive layer on a substrate;
   forming a first dielectric layer on the first conductive layer;
   patterning the first dielectric layer to form a first opening exposing the first conductive layer;
   forming a first metal plug in the first opening to electrically connect the first conductive layer;
   forming a GMR magnetic layer on the first dielectric layer and the first metal plug;
   dividing the GMR magnetic layer into two separate portions of the GMR magnetic layer within the same level, one of the two separate portions being an intermediate conductive layer and the other of the two separate portions being a memory bit layer;
   forming a second dielectric layer on the intermediate conductive layer and the memory bit layer;
   patterning the second dielectric layer to form a second opening exposing the intermediate conductive layer;
   forming a second metal plug in the second opening to be in contact with the intermediate conductive layer; and
   forming a second conductive layer in contact with the second dielectric layer and the second metal plug.

7. The MRAM memory process of claim 6, further comprising forming the first metal plug and the second metal plug as a stacked metal plug.

8. The MRAM memory process of claim 6, further comprising forming the first metal plug and the second metal plug respectively as non-stacked metal plugs.

9. The MRAM memory process of claim 6, wherein the first metal plug is a tungsten plug.

10. The MRAM memory process of claim 6, wherein the second metal plug is a tungsten plug.

* * * * *